United States Patent
Dobkin et al.

[11] Patent Number: 5,148,118
[45] Date of Patent: Sep. 15, 1992

[54] LEVEL SHIFT CIRCUIT WITH GAIN ENHANCEMENT

[75] Inventors: Robert C. Dobkin, Monte Sereno; John W. Wright, Los Altos, both of Calif.

[73] Assignee: Linear Technology Corporation, Milpitas, Calif.

[21] Appl. No.: 673,475

[22] Filed: Mar. 22, 1991

[51] Int. Cl.$^5$ .................................... H03F 3/45
[52] U.S. Cl. ..................... 330/252; 330/288
[58] Field of Search ............... 307/264, 296.1; 330/252, 257, 288, 296, 311; 323/315, 316

[56] References Cited

U.S. PATENT DOCUMENTS

| | | | |
|---|---|---|---|
| 3,562,660 | 2/1971 | Pease | 330/252 X |
| 4,743,862 | 5/1988 | Scheinberg | 330/288 X |
| 4,767,946 | 8/1988 | Taylor | 330/296 X |

OTHER PUBLICATIONS

Data Sheet, "IM741/IM741A/IM741C/IM741E Operational Amplifiers," National Semiconductor Corporation 1982 Linear Databok, pp. 3-257 et seq.
Data Sheet, "IM118/IM218/IM318 Operational Amplifiers," National Semiconductor Corporation 1986 Linear Databook, pp. 3-165 et seq.
Data Sheet "Im101A/IM301A/IM107/IM307 Operational Amplifiers," Linear Technology Corporation 1986 Linear Databook, pp. 2-177 et seq.
Data Sheet, "LT118A/LT318A/IM118/IM318 High Speed Operational Amplifier," National Semiconductor Corporation 1986 Linear Databook, pp. 2-191 et seq.
Data Sheet, "LM101A/LM201A/LM301A Operational Amplifiers," National Semiconductor Corporation 1982 Linear Databook, pp. 3-128 et seq.

*Primary Examiner*—Steven Mottola
*Attorney, Agent, or Firm*—Mark D. Rowland

[57] ABSTRACT

A new level shifting circuit is presented which does not restrict the upper limit of the common-mode input range of an operational amplifier. This is important particularly in operational amplifiers designated to operate with low power supply voltages. Significant parameters. of the operational amplifier, such as the gain and the slew rate, can be controlled without adversely affecting the common-mode input voltage range. The level shifting stage operates nondifferentially to avoid stability problems found in differential stages. A further improvement is accomplished using current balancing to achieve gain enhancement.

17 Claims, 3 Drawing Sheets

LEVEL SHIFT CIRCUIT WITH GAIN ENHANCEMENT

BACKGROUND OF THE INVENTION

The present invention relates to improvements in the performance of integrated circuit amplifiers. More particularly, the present invention relates to improvements in the level shifting stage of an amplifier.

In typical voltage amplifiers, several NPN common-emitter gain stages are usually cascaded to achieve a high voltage gain. In discrete amplifiers, large-value capacitors can be used to couple the ac signal from one gain stage to the next without affecting dc bias levels in the amplifier. However, in integrated amplifiers, large-value coupling capacitors are usually not available because they require too much chip area. Therefore, to ensure adequate low-frequency response, the gain stages in integrated amplifiers are typically dc coupled. However, the output dc level in an NPN common-emitter gain stage is higher than the input dc level. Therefore, in a cascade of such gain stages, the dc level builds up, and it is considerably higher at the output of the last stage than at the input of the first stage. The output dc level therefore approaches the positive power supply voltage, and this reduces the possible swing of the output voltage of the amplifier.

The dc level build-up can be avoided in circuits using complementary NPN and PNP gain stages, but this approach is usually avoided because monolithic PNP transistors have poor gain and frequency characteristics.

A better way of overcoming the dc level build-up is to interpose a level shifting stage between each gain stage pair. The purpose of such a level shifting stage is to move the dc level downwards, and at the same time to act as a unity gain buffer for the ac signal. To fulfill its role as a buffer, a level shifting stage is required to have a relatively high input impedance, and a relatively low output impedance.

Various circuits have been proposed for level shifting stages. A popular conventional level shifting circuit is that of the LM118 operational amplifier commercially available from National Semiconductor Corporation and other manufacturers, which uses a differential PNP transconductance stage driving a differential current mirror. This level shifting stage is placed between a differential input stage and a main gain stage. In such designs, the deleterious effects of the PNP transistors in the level shifting stage can be reduced by the use of feedforward compensation, as is done in the LM118.

In an amplifier circuit in which feedforward compensation is used to bypass a slow PNP level shifting stage, it is desirable at high frequencies to convert the differential input signal to a single-ended signal prior to the level shifting stage. This has been accomplished in the LM118, for example, using a shunt capacitor to eliminate one-half of the high frequency signal provided to the level shifting stage, and it extends the useful bandwidth of the operational amplifier. The shunt capacitor, however, can cause settling time problems.

Applicants have invented an improved way to provide a single-ended signal from a differential input stage to a subsequent level shifting stage (or other type of second stage) without a shunt capacitor. This is achieved by directly coupling only one side of the input stage to the level shifting stage, and by generating a reference signal for input to other side of the level shifting stage which tracks the non-signal dc component of the directly coupled signal. For a further discussion of that invention, see applicants' co-pending application Ser. No. 07/673,466 filed concurrently herewith, entitled "Precise Reference Voltage Generator For Feedforward Compensated Amplifiers."

The type of conventional level shifting stage used in the LM118 has the disadvantage that it reduces the upper limit of the common-mode input voltage range of the amplifier to a value significantly below the positive supply voltage. This is because, as explained more fully elsewhere herein, there are several constraints that require the input dc levels of the level shifting stage to be more than a volt below the positive supply voltage for the amplifier. This disadvantage is especially important in amplifiers designed to work with low supply voltages.

The LM118 type of level shifting circuit also has the disadvantage that the differential PNP transistors, combined with the current mirror, introduces a phase delay that erodes amplifier stability for a given bandwidth. In the LM118, although one-half of the high frequency signal going into the level shifting stage is eliminated by the shunt capacitor, the other half of the high frequency signal is fed into the level shifting stage at the same time that it is being fed forward around this stage. The high frequency signal going through the level shifting stage appears at the output of the level shifting stage significantly out of phase with the fed forward high frequency signal. A primary cause of the phase shift through the level shifting stage is the differential operation of the PNP transistors which requires the signal to go through the current mirror. This phase shift causes the signal going through the level shifting stage to interfere with the fed forward signal, creating the above-mentioned erosion in stability. Thus, a level shifting circuit that did not require the high frequency signal to pass through the current mirror would have relatively less phase delay, and would provide a preferable level shifting circuit for use in a feedforward compensated amplifier which is single-ended before the level shifting stage.

In two other known operational amplifier circuits, the LM101A and LM741 commercially available from the National Semiconductor Corporation and other manufacturers, level shifting and differential-to-single ended conversion is accomplished in the input stage. The input stage includes a differential pair of NPN input transistors emitter coupled respectively to a pair of level shifting PNP transistors, which in turn drive a current mirror circuit. The PNP transistors are commonly driven by a current source connected to the base of each PNP transistor. The current conducted by each PNP transistor is differential, such that a differential change in either input causes a change in the current conducted by each PNP transistor, as well as a change in the current conducted by each side of the current mirror. Disadvantageously, the differential operation of the PNP transistors and the current mirror cause significant phase delay in a high frequency signal, similar to the level shifting stage of the LM118.

In view of the foregoing, it would be desirable to provide a circuit for a level shifting stage which does not require its input voltages to be significantly lower than the positive power supply voltage, thereby avoiding the possibility that the level shifting stage would limit the common-mode input voltage range or low voltage operation of an amplifier circuit.

It would further be desirable to provide a level shifting stage which does not require a single-ended high frequency signal to pass through a current mirror, thereby avoiding excess phase delay in the level shifting stage.

SUMMARY OF THE INVENTION

It is an object of this invention to provide an improved level shifting stage which does not limit the common-mode input voltage range or low voltage operation of integrated circuit differential amplifiers.

It is also an object of this invention to provide an improved level shifting stage the transconductance of which can be controlled without compromising the common-mode input voltage range of an amplifier.

It is a further object of the present invention to provide an improved level shifting stage in which current balancing is used to achieve gain enhancement.

It is an additional object of the present invention to provide an improved level shifting stage in which a current mirror circuit can be provided to achieve dc balance between two circuit branches of the level shifting stage without introducing excess phase delay into the path of a high frequency single-ended signal fed into the stage.

These and other objects of the invention are accomplished by a level shifting stage which includes a transconductance stage comprising a pair of NPN transistors, a pair of resistors and a pair of PNP transistors. The level shifting stage uses NPN emitter followers to track the output voltage of the differential input stage. The voltage outputs from the emitter followers are converted to responsive currents by coupling the outputs of the emitter followers through a pair of resistors connected to the emitters of the PNP transistors. The bases of the PNP transistors are biased at a controlled voltage such that a change in the base-emitter voltage of one PNP transistor does not cause a change in the base-emitter voltage of the other PNP transistor. The non-differential currents flowing out of the collectors of the PNP transistors are then fed into a current mirror circuit to perform dc balancing.

In a preferred embodiment, the gain of the level shifting stage is enhanced by adding transistors to balance the currents flowing in the two sides of the circuit.

BRIEF DESCRIPTION OF THE DRAWINGS

The above and other objects of the present invention will be more apparent upon consideration of the following detailed description taken in conjunction with the accompanying drawings in which like reference characters refer to like parts throughout, and in which.

DETAILED DESCRIPTION OF THE INVENTION

Figure 1:
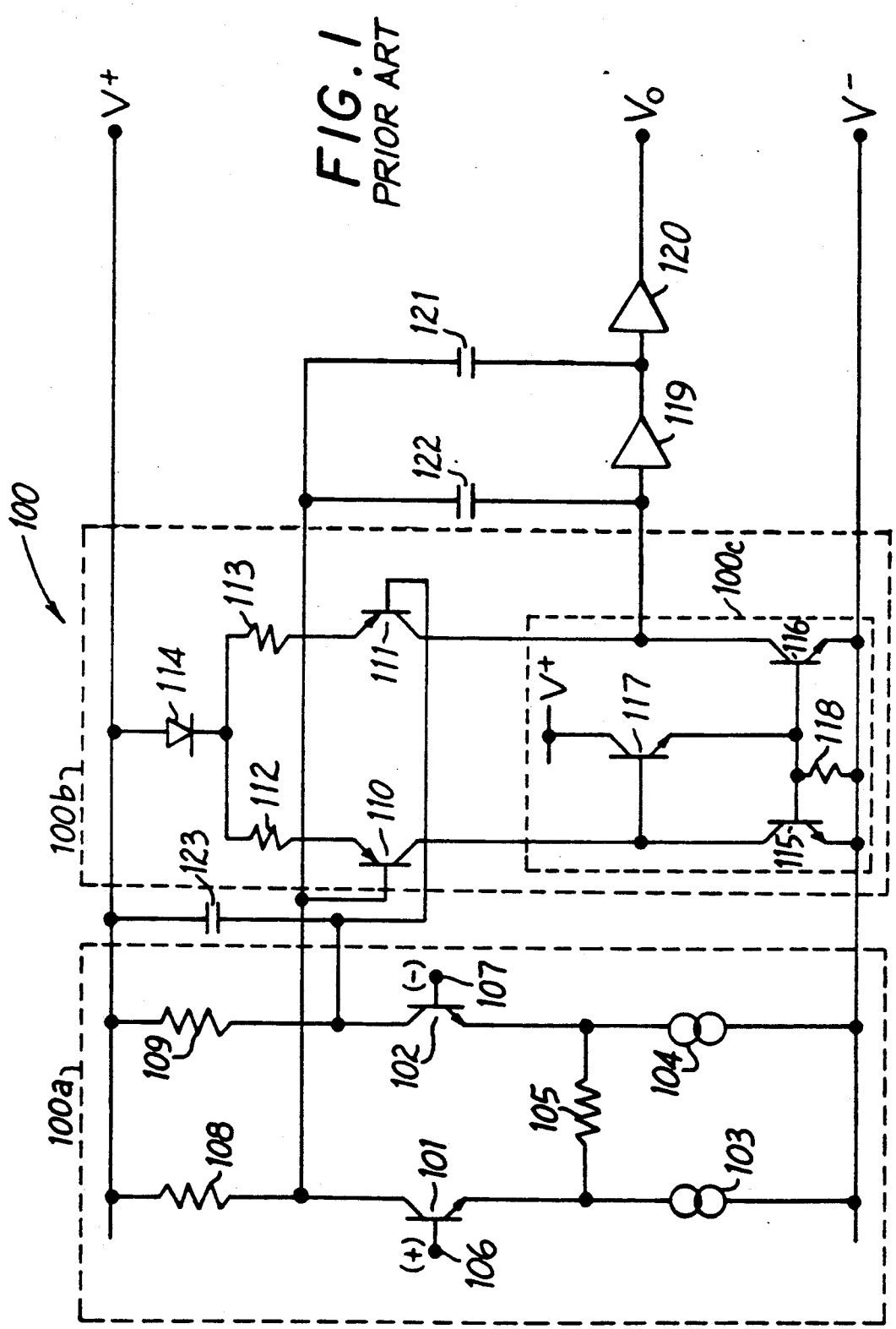
FIG. 1 is a simplified block schematic diagram of a conventional operational amplifier.

FIG. 1 shows a simplified conventional operational amplifier 100 including a differential input stage 100a and a level shifting stage 100b. Transistors 101 and 102, current sources 103 and 104, and resistors 105, 108 and 109 form the differential input stage 100a. A differential input voltage applied between the non-inverting input terminal 106 and the inverting input terminal 107 of amplifier 100 causes an amplified differential voltage to appear between the collectors of transistors 101 and 102. This voltage is fed to the bases of PNP transistors 110 and 111 in the level shifting stage 100b, and is converted to a differential current at the collectors of PNP transistors 110 and 111. The quiescent currents for PNP transistors 110 and 111 are determined by the values of resistors 112 and 113, the voltage drop across diode 114 and the voltages at the collectors of transistors 101 and 102. The differential current is fed to current mirror 100c, comprising transistors 115 and 116, which converts the differential current into a single-ended voltage at the collector of transistor 116. Transistor 117 and resistor 118 supply base current for transistors 115 and 116. The single-ended voltage at the collector of transistor 116 is further amplified by gain stage 119 and buffer stage 120. The output of buffer stage 120 is coupled to an output terminal $V_o$ of amplifier 100. Narrowbanding and feedforward frequency compensation are provided respectively by capacitors 121 and 122. Shunt capacitor 123 is provided to eliminate one-half of the high frequency signal provided to the level shifting stage.

The design of an operational amplifier with a conventional level shifting stage as described above involves several compromises in which the common-mode input range can only be increased at the expense of amplifier gain, amplifier slew rate, or level shifting stage transconductance. These compromises are associated with the choice of the bias voltages at the collectors of transistors 101 and 102 as described more fully in the following paragraphs.

The gain of the differential input stage is proportional to the value of resistors 108 and 109, and thus is proportional to the voltage dropped across these resistors. The gain of the amplifier is therefore one parameter which affects the choice of the bias voltages at the collectors of transistors 101 and 102.

The slew rate of the amplifier is proportional to the current supplied by current sources 103 and 104 divided by the value of capacitor 121. The minimum capacitance is limited by frequency compensation considerations, so the slew rate is increased by increasing the current supplied by current sources 103 and 104. Increasing these currents causes the voltages across resistors 108 and 109 to increase. Thus, optimization of the slew rate affects the choice of the bias voltages at the collectors of transistors 101 and 102.

The third parameter whose value affects and is affected by the collector voltages of transistors 101 and 102 is the transconductance of the PNP level shift. PNP transistors 110 and 111 introduce a pole into the amplifier's transfer function and thus limit the bandwidth of the amplifier. The presence of the feedforward capacitor introduces a zero into the transfer function. The frequency of the zero is determined by the value of the feedforward capacitor and the transconductance of the PNP level shift. Thus, by careful adjustment of these parameters, the pole and the zero can be made to counteract each other and in so doing, the bandwidth of the amplifier is increased. The transconductance of the PNP level shift is inversely proportional to the sum of the emitter resistances ($r_e$) of transistors 110 and 111 and the values of the resistors 112 and 113. The emitter resistances ($r_e$) of transistors 110 and 111 are, in turn, inversely proportional to the emitter currents of those transistors. And the emitter currents are themselves determined by the difference between the cathode voltage of diode 114 and the emitter voltages of transistors 110 and 111 divided by the value of resistors 112 and 113. The transconductance of the level shift can therefore be set at a desired level by manipulating the values of resistors 112 and 113, or by introducing additional voltage drop into the emitter circuits of transistors 110 and 111 (e.g., using diode 114). These operations affect the choice of the bias voltages at the collectors of transistors 101 and 102.

The collector voltages of transistors 101 and 102 directly influence the common-mode input voltage range. The collector-base junction of transistors 101 and 102 must be reverse biased, so any decrease in the collector voltages results in a decrease in the maximum voltage that can be applied to the bases of transistors 101 and 102 to prevent saturation of the input stage. Thus, in operational amplifiers using a conventional level shifting stage such as that shown in FIG. 1, common-mode input voltage range is restricted by gain, slew rate, and feedforward compensation considerations.

Figure 2:
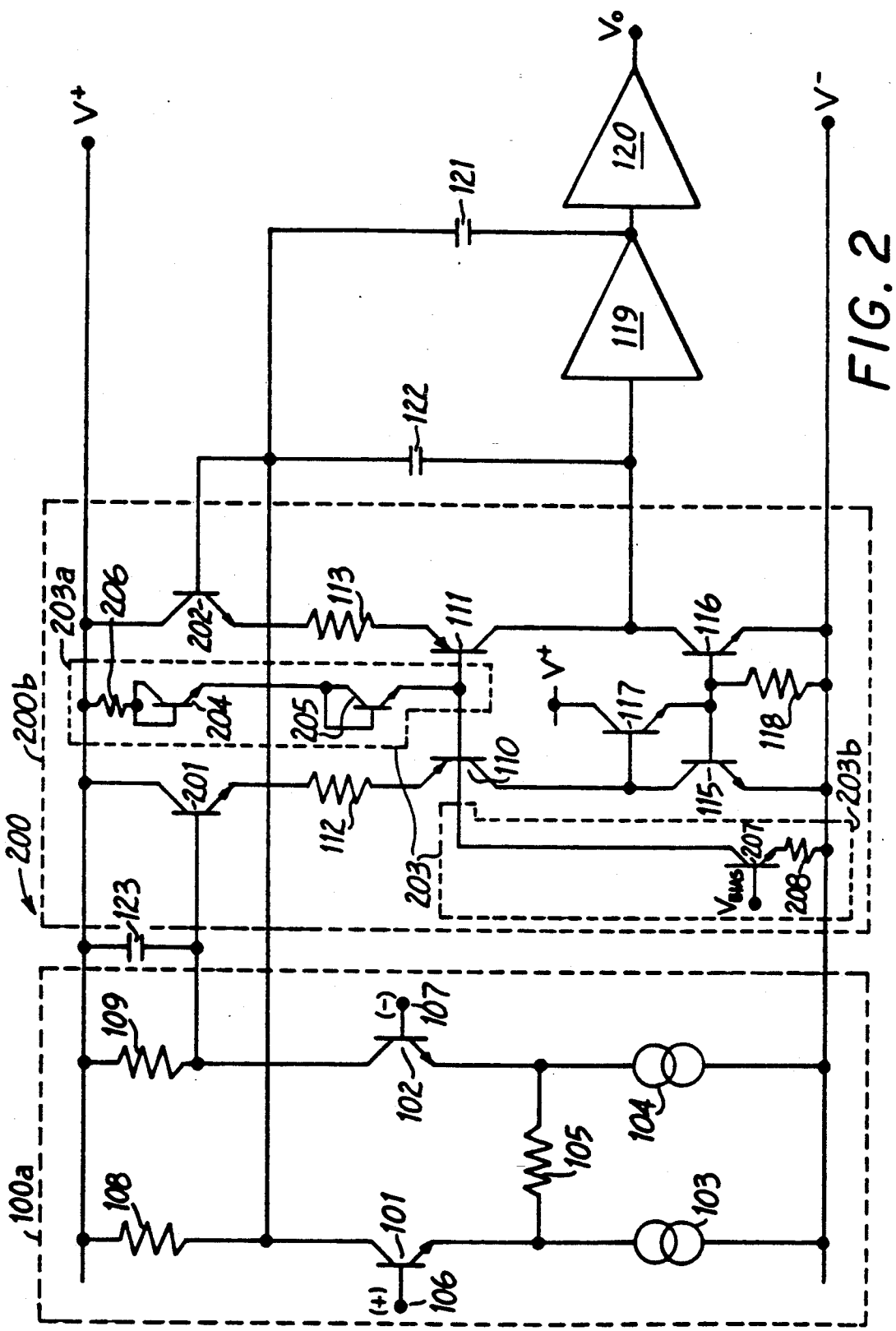
FIG. 2 is a simplified block schematic diagram of an operational amplifier including an embodiment of the level shifting stage of the present invention.

The common-mode input voltage range limitation described above is eliminated in the embodiment of the invention shown in FIG. 2. In amplifier circuit 200, the bases of transistors 110 and 111 are no longer driven by the output of differential input stage 100a; instead, they are connected to a bias voltage circuit 203, which, for example, may include as shown a voltage-setting string 203a of diode-connected transistors 204, 205 and resistor 206 connected between V+ and the bases of transistors 110 and 111, and a current source 203b connected between the bases of transistors 110 and 111 and V− including transistor 207 driven by a bias voltage $V_{BIAS}$ and an emitter resistor 208.

The outputs of the differential input stage are now connected to the bases of NPN transistors 201 and 202 which act as emitter followers. However, because NPN transistors 201 and 202 add a phase reversal to each side of level shifting stage 200b not present in the conventional level shifting stage 100b of FIG. 1, the outputs of the input stage are reversed when connecting them to the level shifting stage. More particularly, the signal output at the collector of transistor 101 is connected to the base of transistor 202 (i.e. the differential output from the non-inverting side of the input stage is connected to the side the level shifting stage connected to the next stage 119 of the amplifier), and the shunted output at the collector of transistor 102 is connected to the base of transistor 201 (i.e. the shunted differential output from the inverting side of the input stage is connected to the side the level shifting stage opposite that connected to the next stage 119 of the amplifier).

Transistors 201 and 202, like transistors 110 and 111 of FIG. 1, provide an impedance buffer at the inputs of the level shifting stage. The high input impedance of the transistor bases prevents the level shifting stage from loading the input stage. The collectors of transistors 201 and 202 are connected to the positive supply voltage, and their emitters are connected to the emitters of transistors 110 and 111 via resistors 112 and 113, respectively.

With the use of level shifting stage 200b of the present invention, the requirements imposed on the collector voltages of transistors 101 and 102 by the level shifting stage are removed. Transistors 201 and 202 can operate with very low collector-base voltages, so the collector voltages of transistors 101 and 102 can be very close to the positive supply voltage. The voltage dropped across diode 114, resistors 112 and 113, and the emitter-base junctions of transistors 110 and 111 no longer appears between the collectors of transistors 101 and 102 and the positive supply voltage. Thus, the upper limit of the common-mode input range is extended; i.e., the common-mode input voltage at which the collector-base junctions of transistors 101 and 102 become forward biased is increased. Prior level shifting stages of the type shown in FIG. 1 typically imposed a drop of approximately two volts between the positive supply voltage and the collectors of transistors 101 and 102. In contrast, the level shifting stage of the present invention permits the imposed voltage to be reduced to approximately half of a volt or less, which is desirable for low voltage circuits.

In addition to increasing the common-mode input voltage range, the level shifting stage of the present invention also allows for more flexible control over the transconductance of the level shifting stage. The emitter voltages of transistors 201 and 202 are approximately 0.7 volts below the collector voltages of the differential input stage, and the emitter voltages of transistors 110 and 111 are approximately 0.7 volts above the bias voltage provided by bias voltage circuit 203. Thus, the voltages across resistors 112 and 113 are well defined, and the current flowing through them can be controlled easily, either by changing the values of resistors 112 and 113 or by changing the bias voltage. In this way, the transconductance of the level shifting stage can be controlled without compromising the common-mode input voltage range of the amplifier.

Bias voltage circuit 203 maintains the bases of transistors 110 and 111 at a fixed voltage, such that a change in the input to either transistor 201 or 202 causes only the current conducted by the PNP transistor on the respective side of the level shifting stage to change. The current conducted by the opposite PNP transistor does not change (assuming the input on its side does not change) because the base-emitter bias on that PNP transistor has not changed. Thus the current conducted by each of PNP transistors 110 and 111 is non-differential, as is the output current conducted by amplifier 119. As a result of this non-differential operation, a single-ended high frequency signal applied to the base of transistor 202 does not pass through the current mirror circuit of the level shifting stage, but instead is coupled directly to amplifier 119 via NPN transistor 202, resistor 113 and PNP transistor 111, as well as by feedforward capacitor 122. Thus the phase shift of the high frequency signal path through the level shifting stage is minimized.

One slight disadvantage of the circuit in FIG. 2 (as well as the circuit in FIG. 1) is a loss of gain caused by current flow to the (non-ideal) input of amplifier 119. This current flow leads to an imbalance in the currents flowing in the two branches of level shifting stage 200b. Extra differential input voltage must be applied to the amplifier to compensate for this imbalance. Thus, the current imbalance reduces the net gain of the amplifier.

Figure 3:
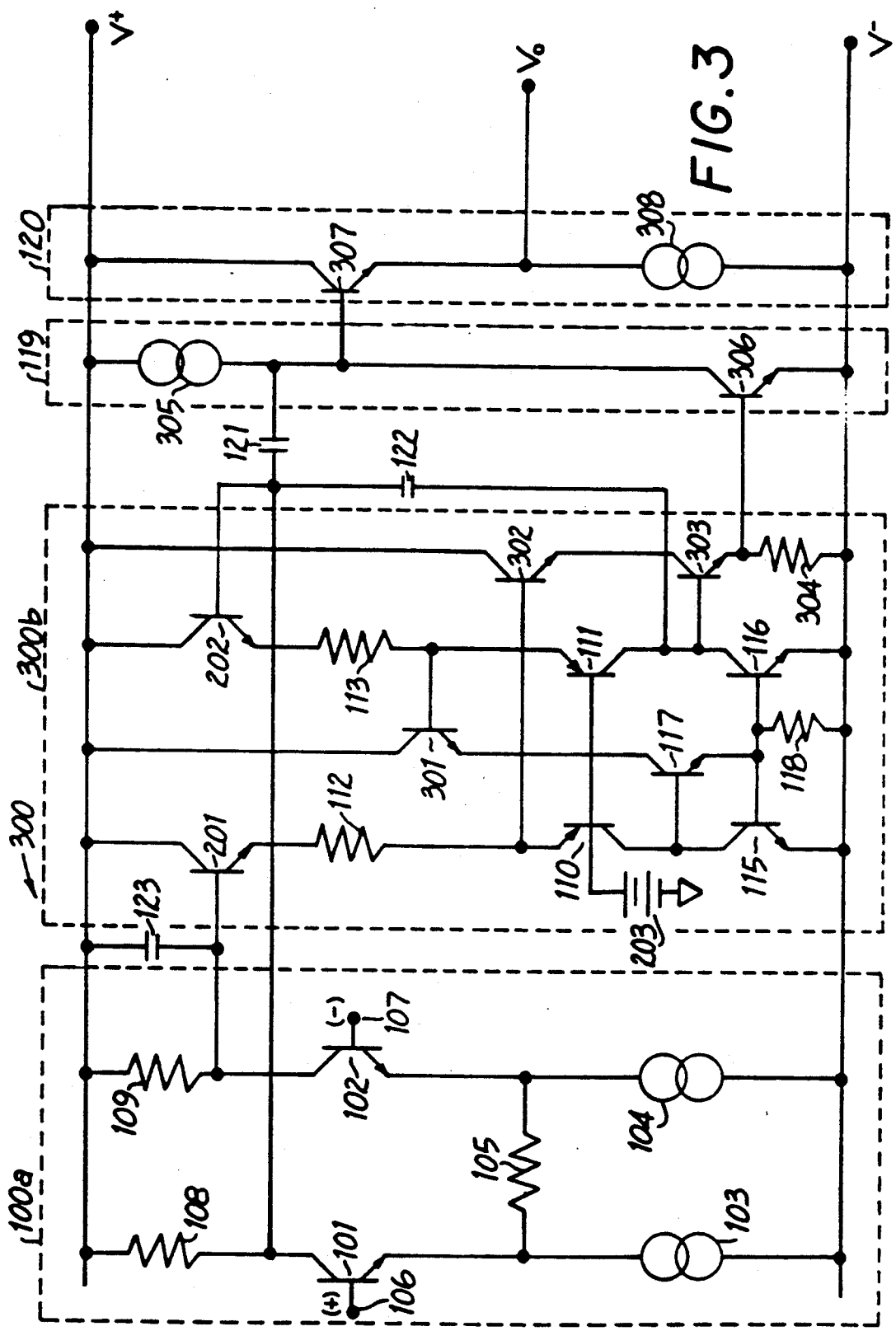
FIG. 3 is a simplified block schematic diagram of an operational amplifier including a preferred embodiment of the level shifting stage of the present invention.

FIG. 3 shows a simplified schematic of an amplifier 300 utilizing a preferred embodiment 300b of the level shifting stage of the present invention including a gain enhancement circuit to eliminate the loss in gain caused by the current imbalance. Amplifiers 119 and 120 are represented by components 303 through 308, and the base current of transistor 303 represents the unbalanced current which flows into amplifier 119 in FIG. 2.

Current balancing is performed primarily by transistor 302. Assuming temporarily that collector currents and emitter currents are substantially equal, any collector current flowing in transistor 303 will also flow in transistor 302. Thus the base currents of these two transistors are substantially the same. The base current of transistor 303 is supplied through transistor 202, and the base current of transistor 302 is supplied through transistor 201. Thus, the same additional current is drawn from both sides of the transconductance stage, resulting in a balanced current drain.

Current balancing is further improved with the addition of transistor 301. The base current in this transistor is equal to the base current of transistor 117 because the collector-emitter circuits of the two transistors are connected in series. Thus, the current drawn by the base of transistor 117 is balanced by the current drawn by the base of transistor 301.

Current balancing results in the same current being drawn from both sides of the transconductance stage, regardless of the amount of output current supplied by the amplifier. Thus, additional differential input voltage is not required to balance the currents, and the gain of the amplifier is enhanced.

The level shifting stage of the present invention can be used with various conventional differential input stage. Alternatively, the present invention can be advantageously combined in an integrated amplifier circuit with a differential input stage or with differential transconductance stages of the type disclosed in applicants' co-pending application Ser. No. 07/673,466, entitled "Precise Reference Voltage Generator For Feedforward Compensated Amplifiers," filed concurrently herewith, the entire disclosure of which is incorporated herein by reference.

The present invention is particularly suited for use in a feedforward compensated amplifier in which the signal path is "single-ended" at high frequencies prior to the level shifting stage, such as by a shunt capacitor, or, preferably, by replacing the shunted path with a reference voltage generator circuit that tracks the non-signal dc component of the single-ended output of the input stage, as described in the above-referenced co-pending application. As previously discussed, the present invention permits a single-ended high frequency signal applied to the base of transistor 202 to be level shifted without passing through the current mirror load of the level shifting stage.

Thus, embodiments of an improved level shift stage have been described. Although the embodiments of the invention have been disclosed with various components connected to other components, persons of ordinary skill in the art will appreciate that it may not be necessary for such connections to be direct, and additional components may be interconnected between the shown connected components without departing from the spirit of the invention as shown. Persons skilled in the art will appreciate also that the present invention can be practiced by other than the described embodiments, which are presented for purposes of illustration and not of limitation, and the present invention is limited only by the claims which follow.

We claim:

1. In an amplifier circuit, a level shifting stage having first and second input terminals and a third terminal, the stage comprising:

voltage follower means connected to the first and second input terminals for providing high input impedance, low output impedance unity-gain amplification of voltage signals applied respectively to the first and second input terminals, the voltage signals being provided by the voltage follower means to first and second voltage follower output terminals;

transconductance means connected to the first and second voltage follower output terminals for conducting, between the output terminals of the voltage follower means and first and second outputs of the transconductance means, first and second currents having magnitudes that vary non-differentially in substantial proportion with variations in the voltage signals at the first and second voltage follower output terminals respectively; and a current mirror having a first current sink input coupled to the first output of the transconductance means, and a second current sink input coupled to the second output of the transconductance means and to the third terminal, whereby an output current is generated at the third terminal.

2. The level shifting stage of claim 1, wherein the transconductance means comprises first and second transconductance circuits, each comprising:

a resistor having a first and a second terminal, the first terminal being coupled to an output terminal of the voltage follower means; and a PNP transistor having an emitter coupled to the second terminal of the resistor, a base coupled to a bias voltage, and a collector coupled to an output of the transconductance means, whereby a current is conducted by the voltage follower output terminal which is substantially proportional to the difference between a voltage applied at a input terminal and the bias voltage, and is substantially inversely proportional to the resistance of the resistor.

3. The level shifting stage of claim 1, wherein the voltage follower means comprises first and second voltage follower circuits, each comprising an NPN transistor with a collector coupled to a power supply voltage, a base coupled to an input terminal, and an emitter coupled to a voltage follower output terminal.

4. The level shifting stage of claim 2, wherein a common predetermined bias voltage is applied to the base of the PNP transistor of the first and second transconductance circuit.

5. The level shifting stage of claim 1, wherein the current mirror comprises:

a first NPN transistor having its collector coupled to the first current sink input of the current mirror;

a second NPN transistor having its base coupled to the base of the first NPN transistor, its emitter coupled to the emitter of the first NPN transistor, and its collector coupled to the second current sink input of the current mirror; and means coupled to the bases of the first and second NPN transistors for biasing the first and second NPN transistors of the current mirror.

6. The level shifting stage of claim 5, wherein the bias means comprises a resistor coupled in parallel with the base-emitter circuits of the first and second NPN transistors, and a third NPN transistor with a base coupled to the collector of the first NPN transistor, a collector coupled to a supply voltage, and an emitter coupled to the bases of the first and second NPN transistors.

7. The level shifting stage of claim 5, wherein the bias means comprises:

a resistor coupled in parallel with the base-emitter circuits of the first and second NPN transistors;

a third NPN transistor with a base coupled to the collector of the first NPN transistor and an emitter coupled to the bases of the first and second NPN transistors; and a fourth NPN transistor having an emitter coupled to the collector of the third NPN transistor, a collector coupled to a supply voltage and a base coupled to a transconductance circuit, whereby the third and fourth NPN transistors conduct base currents that subtract substantially equal amounts of current from the first and second currents conducted by the transconductance means.

8. The level shifting stage of claim 1, further comprising:

a pair of NPN transistors, one of the pair having a base coupled to the third terminal for providing an output signal at its emitter, and the other of the pair having a base coupled to a transconductance circuit, whereby the pair of NPN transistors conduct base currents that subtract substantially equal amounts of current from the first and second currents conducted by the transconductance means.

9. In a monolithic integrated circuit having a differential input stage, and a level shifting stage with a first terminal, a second terminal, and a third terminal, a method of shifting the dc level of a differential voltage between the first and second terminals into a single-ended voltage, the method comprising the steps of:

following voltage variations of the first terminal with a first low impedance voltage source to provide a first intermediate voltage whose variations substantially duplicate the voltage variations of the first terminal;

following voltage variations of the second terminal with a second low impedance voltage source to provide a second intermediate voltage whose variations substantially duplicate the voltage variations of the second terminal;

generating a first non-differential current substantially proportional to the first intermediate voltage;

generating a second non-differential current substantially proportional to the second intermediate voltage; and generating a current at the third terminal substantially equal to the difference between the first current and the second current.

10. The method of claim 9, wherein the first and second non-differential currents are generated respectively by first and second PNP transistors to the base of each is applied a predetermined bias voltage.

11. The method of claim 10, wherein the predetermined bias voltages applied to the base of the first PNP transistor is substantially equal to the predetermined bias voltage applied to the base of the second PNP transistor.

12. The method of claim 9, wherein the first non-differential current is generated at a collector of a first PNP transistor, and the second non-differential current is generated at a collector of a second PNP transistor, and the method further comprises the step of subtracting from emitter current conducted by the first PNP transistor a balancing current substantially equal to the current generated at the third terminal, whereby gain of the converting method can be increased.

13. The method of claim 9, wherein the first non-differential current is generated at a collector of a first PNP transistor and sunk by a collector of a first current mirror transistor, and the second non-differential current is generated at a collector of a second PNP transistor and partially sunk by a collector of a second current mirror transistor and partially conducted by the third terminal, and the method further comprises the step of subtracting from one of the first and second non-differential currents a current for controlling the current mirror transistors, and subtracting a substantially equal balancing current from the other of the first and second non-differential currents.

14. The method of claim 13, wherein the balancing current is subtracted from current at the emitter of the second PNP transistor.

15. The method of claim 14, wherein the controlling and balancing currents are subtracted respectively by base currents drawn by NPN transistors.

16. A circuit for enhancing the gain of a level shifting stage of an amplifier, the stage including a non-differential level shifting circuit having two branches and a current mirror circuit providing a current load for each branch, the two branches of the level shifting circuit generating independently of one another first and second currents responsive respectively to first and second input signals applied to the stage, and the current mirror circuit generating a single-ended output current responsive to the first and second currents, the output current being provided to the base of a transistor in a gain stage of the amplifier, and the gain stage transistor having a collector-emitter circuit which conducts current responsive to the output current, the enhancing circuit comprising:

a first balancing transistor having a base connected to the level shifting stage, and a collector-emitter circuit connected to conduct substantially all current conducted by the collector-emitter circuit of the gain stage transistor, whereby the base of the first balancing transistor draws a current substantially equal to the output current to enhance the gain of the level shifting stage by compensating for an imbalance in quiescent levels of the first and second currents caused by the output current drawn by the base of the gain stage transistor.

17. The gain enhancement circuit of claim 16, wherein the current mirror circuit includes a control transistor having a base connected to subtract a current from one or the other of the first and second currents conducted by the level shifting circuit, and having a collector-emitter circuit connected to provide a drive current to the current mirror circuit responsive to the subtracted current drawn by the base of the control transistor, the gain enhancement circuit further comprising:

a second balancing transistor having a base connected to the level shifting stage, and a collector-emitter circuit connected to conduct substantially all current conducted by the collector-emitter circuit of the control transistor, whereby the base of the second balancing transistor draws a current substantially equal to the subtracted current to enhance the gain of the level shifting stage by compensating for an imbalance in quiescent levels of the first and second currents caused by the current drawn by the base of the control transistor.

* * * * *

UNITED STATES PATENT AND TRADEMARK OFFICE
CERTIFICATE OF CORRECTION

PATENT NO. : 5,148,118  Page 1 of 2
DATED : September 15, 1992
INVENTOR(S) : Robert C. Dobkin and John W. Wright It is certified that error appears in the above-identified patent and that said Letters Patent is hereby corrected as shown below:

In The Abstract: Title page, col. 2, item [57]

Line

4    "designated" should be -- designed --.

6    After "parameter", delete period -- . --.

Column  Line 1    68    After "input to", insert -- the --.

UNITED STATES PATENT AND TRADEMARK OFFICE
CERTIFICATE OF CORRECTION

PATENT NO. : 5,148,118
DATED : September 15, 1992
INVENTOR(S) : Robert C. Dobkin and John W. Wright It is certified that error appears in the above-identified patent and that said Letters Patent is hereby corrected as shown below:

Title page, item [56],

Under References Cited

"IM741/IM741A/IM741C/IM741E ... Linear Databok" should be
-- LM741/LM741A/IM741C/LM741E ... Linear Databook --.

"IM118/IM218/IM318 ... 1986 Linear Databook" should be
-- LM118/LM218/LM318 ... 1982 Linear Databook --.

"'Im101A/IM301A/IM107/IM307 Operational Amplifiers,' Linear Technology" should be -- 'LM101A/LM301A/LM107/LM307 Operational Amplifiers,' National Semiconductor --.

"LT118A/LT318A/IM118/IM318" should be
-- LT118A/LT318A/LM188/LM318 -- .

Signed and Sealed this

Thirteenth Day of December, 1994

Attest:

BRUCE LEHMAN

Attesting Officer     Commissioner of Patents and Trademarks